United States Patent
Ko et al.

(10) Patent No.: US 10,964,530 B2
(45) Date of Patent: Mar. 30, 2021

(54) METHOD OF FORMING BLOCKING SILICON OXIDE FILM, AND STORAGE MEDIUM

(71) Applicant: TOKYO ELECTRON LIMITED, Tokyo (JP)

(72) Inventors: Kyungseok Ko, Hwaseong-si (KR); Hiromi Shima, Nirasaki (JP); Eiji Kikama, Nirasaki (JP); Keisuke Suzuki, Nirasaki (JP); Shingo Hishiya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 134 days.

(21) Appl. No.: 16/173,214

(22) Filed: Oct. 29, 2018

(65) Prior Publication Data
US 2019/0131126 A1 May 2, 2019

(30) Foreign Application Priority Data

Oct. 31, 2017 (JP) .............................. JP2017-210435

(51) Int. Cl.
*C23C 16/40* (2006.01)
*C23C 16/34* (2006.01)
(Continued)

(52) U.S. Cl.
CPC ...... *H01L 21/02164* (2013.01); *H01L 21/022* (2013.01); *H01L 21/0228* (2013.01);
(Continued)

(58) Field of Classification Search
CPC ............ H01L 21/02164; H01L 21/022; H01L 21/0211; H01L 21/0228; H01L 23/53295; C23C 16/345; C23C 16/402; C23C 16/24
See application file for complete search history.

(56) References Cited

U.S. PATENT DOCUMENTS 4,716,131 A * 12/1987 Okazawa .......... H01L 21/32105
257/410
5,658,822 A * 8/1997 Wu .................... H01L 21/32
257/E21.258
(Continued)

FOREIGN PATENT DOCUMENTS

JP 2017-117977 A 6/2017
WO WO 2016/178978 * 11/2016 ........... C23C 16/455

OTHER PUBLICATIONS

Park, Kee-Chan, et al., "The grain growth blocking effect of polycrystalline silicon film by thin native silicon oxide barrier during the excimer laser recrystallization". Applied Physics Letters, vol. 75, No. 4, Jul. 26, 1999, pp. 460-462.*
(Continued)

*Primary Examiner* — Bret P Chen
(74) *Attorney, Agent, or Firm* — Nath, Goldberg & Meyer; Jerald L. Meyer

(57) ABSTRACT

A method of forming a blocking silicon oxide film on a target surface on which a silicon oxide film and a silicon nitride film are exposed, includes: placing a workpiece having the target surface on which the silicon oxide film and the silicon nitride film are exposed in a processing container under a depressurized atmosphere; forming a spacer polysilicon film to be a sacrificial film on the target surface on which the silicon oxide film and the silicon nitride film are exposed; and substituting the spacer polysilicon film with a substitution silicon oxide film by supplying thermal energy, oxygen radicals and hydrogen radicals onto the workpiece.

10 Claims, 11 Drawing Sheets

(51) Int. Cl.
*H01L 21/02* (2006.01)
*H01L 23/532* (2006.01)
*H01L 21/67* (2006.01)
*H01L 21/321* (2006.01)
*H01L 27/11582* (2017.01)
*H01L 21/28* (2006.01)

(52) U.S. Cl.
CPC .. *H01L 21/02211* (2013.01); *H01L 21/32105* (2013.01); *H01L 21/67011* (2013.01); *H01L 23/53295* (2013.01); *H01L 21/67017* (2013.01); *H01L 21/67109* (2013.01); *H01L 27/11582* (2013.01); *H01L 29/40117* (2019.08)

(56) References Cited

U.S. PATENT DOCUMENTS

| | | | | |
|---|---|---|---|---|
| 6,177,318 | B1* | 1/2001 | Ogura | H01L 27/11521 |
| | | | | 257/E21.679 |
| 6,323,127 | B1* | 11/2001 | Andricacos | H01L 28/65 |
| | | | | 257/E21.013 |
| 9,685,320 | B2* | 6/2017 | Kang | H01J 37/32091 |
| 10,020,314 | B1* | 7/2018 | Baraskar | H01L 27/11556 |
| 2002/0028541 | A1* | 3/2002 | Lee | H01L 27/11556 |
| | | | | 438/149 |
| 2004/0048481 | A1* | 3/2004 | Kang | H01L 29/40117 |
| | | | | 438/696 |
| 2007/0042546 | A1* | 2/2007 | Thomas | H01L 29/40114 |
| | | | | 438/257 |
| 2008/0105915 | A1* | 5/2008 | Park | H01L 29/66825 |
| | | | | 257/314 |
| 2009/0003082 | A1* | 1/2009 | Meeks | H01L 27/1052 |
| | | | | 365/185.28 |
| 2009/0003083 | A1* | 1/2009 | Meeks | H01L 29/685 |
| | | | | 365/185.28 |
| 2011/0260228 | A1* | 10/2011 | Kawashima | H01L 29/4234 |
| | | | | 257/298 |
| 2013/0344669 | A1* | 12/2013 | Feng | H01L 29/7835 |
| | | | | 438/286 |
| 2015/0145023 | A1* | 5/2015 | Arigane | H01L 27/11568 |
| | | | | 257/326 |
| 2015/0155297 | A1* | 6/2015 | Eom | H01L 29/66833 |
| | | | | 438/268 |
| 2016/0086970 | A1* | 3/2016 | Peng | H01L 27/11565 |
| | | | | 257/324 |
| 2016/0336182 | A1* | 11/2016 | Yokota | H01L 29/788 |
| 2017/0117037 | A1* | 4/2017 | Mokhlesi | G11C 16/0483 |
| 2017/0271527 | A1 | 9/2017 | Higuchi et al. | |
| 2018/0269227 | A1* | 9/2018 | Carlson | G11C 16/0483 |
| 2019/0080913 | A1* | 3/2019 | Ko | C23C 16/045 |

OTHER PUBLICATIONS

Choi, Yang-Kyu, et al., "Fabrication of Sub-10-nm Silicon Nanowire Arrays by Size Reduction Lithography". J. Phys. Chem. B, vol. 107, No. 15, 2003, pp. 3340-3343.*

Jiang, Hongrui, et al., "Fabrication of thick silicon dioxide sacrificial and isolation blocks in a silicon substrate". J. Micromech. Microeng. 12 (2002) 87-95.*

Takeda, Ken-ichi, et al., "Copper blocking ability of nitrogen-incorporated silicon oxide film". J. Vac. Sci. Technol. B 21 (4), Jul./Aug. 2003, pp. 1323-1328.*

Shih, Po-Sheng, et al., "A Novel Lightly Doped Drain Polysilicon Thin-Film Transistor with Oxide Sidewall Spacer Formed by One-Step Selective Liquid Phase Deposition". IEEE Electron Device Letters, vol. 20, No. 8, Aug. 1999, pp. 421-423.*

Bashir, R., et al., "PLATOP: A Novel Planarized Trench Isolation and Field Oxide Formation Using Poly-Silicon". IEEE Electron Device Letters, vol. 17, No. 7, Jul. 1996, pp. 421-423.*

* cited by examiner

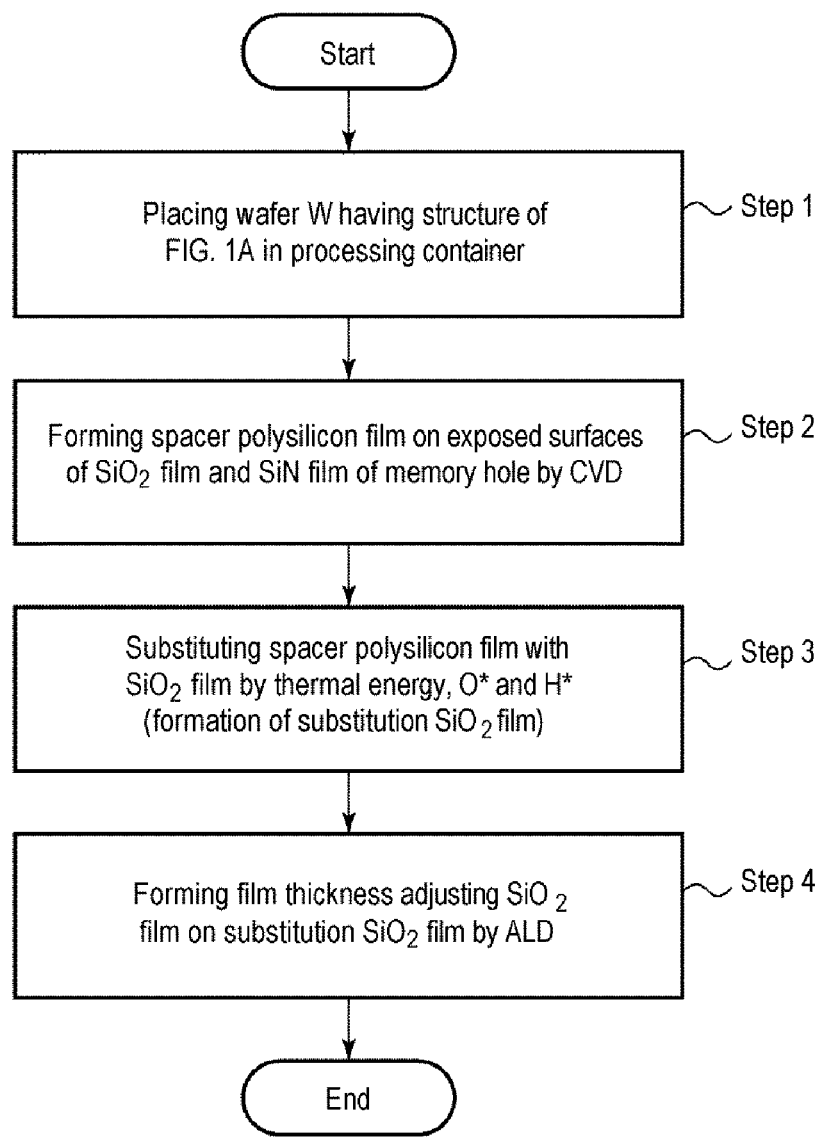

METHOD OF FORMING BLOCKING SILICON OXIDE FILM, AND STORAGE MEDIUM

CROSS-REFERENCE TO RELATED APPLICATION

This application is based upon and claims the benefit of priority from Japanese Patent Application No. 2017-210435, filed on Oct. 31, 2017, the entire contents of which are incorporated herein by reference.

TECHNICAL FIELD

The present disclosure relates to a method and apparatus for forming a silicon oxide film on a target surface on which a silicon oxide film and a silicon nitride film are exposed.

BACKGROUND

For example, in a process of manufacturing a 3D-NAND type nonvolatile semiconductor device, a laminated film including a plurality of silicon oxide films ($SiO_2$ films) and a plurality of silicon nitride films (SiN films) alternately laminated is formed, a memory hole (channel hole) is formed in the laminating direction, a $SiO_2$ film, a SiN film and a $SiO_2$ film are sequentially formed in the memory hole by CVD, ALD or the like, a polysilicon film is formed, and then the center part of the memory hole is filled with a $SiO_2$ film to form a channel part. Thereafter, a trench is formed in the laminating direction of the laminated film, the SiN film is removed by wet etching through the trench, a tungsten film to be a gate electrode is buried in a space generated after the removal of the SiN film via a TiN film, and the trench is filled with an $SiO_2$ film or the like.

In recent years, as the design rule of semiconductor devices has been increasingly miniaturized, there is a need to form a thin and uniform $SiO_2$ film, on the surface of a laminated film of a $SiO_2$ film and a SiN film in which a memory hole is formed, by CVD or ALD.

However, when the $SiO_2$ film is formed on the surface of the laminated film of the $SiO_2$ film and the SiN film by CVD or ALD, since sub-oxide (grown oxide) is formed on the surface of the $SiO_2$ film in the laminated film, which makes the incubation time of the $SiO_2$ film longer than that of the SiN film, the $SiO_2$ film formed on the surface of the laminated film is thinner at the $SiO_2$ film portion of the laminated film and is thicker at the SiN film portion thereof, which makes it difficult to form a thin and uniform $SiO_2$ film.

SUMMARY

Some embodiments of the present disclosure provide a technique capable of forming a silicon oxide film having a thin and uniform thickness on a target surface on which a silicon oxide film and a silicon nitride film are exposed.

According to one embodiment of the present disclosure, there is provided a method of forming a blocking silicon oxide film on a target surface on which a silicon oxide film and a silicon nitride film are exposed, including: placing a workpiece having the target surface on which the silicon oxide film and the silicon nitride film are exposed in a processing container under a depressurized atmosphere; forming a spacer polysilicon film to be a sacrificial film on the target surface on which the silicon oxide film and the silicon nitride film are exposed; and substituting the spacer polysilicon film with a substitution silicon oxide film by supplying thermal energy, oxygen radicals and hydrogen radicals onto the workpiece.

According to another embodiment of the present disclosure, there is provided an apparatus for forming a blocking silicon oxide film on a target surface on which a silicon oxide film and a silicon nitride film are exposed, including: a processing container in which a workpiece having the target surface on which the silicon oxide film and the silicon nitride film are exposed is accommodated; a gas supply part configured to supply a predetermined gas into the processing container; a heating mechanism configured to heat an interior of the processing container; an exhaust mechanism configured to exhaust the interior of the processing container to bring the processing container into a depressurized state; and a control part configured to control the gas supply part, the heating mechanism and the exhaust mechanism, wherein the control part controls the gas supply part, the heating mechanism and the exhaust mechanism to perform a process including: keeping the interior of the processing container under a predetermined depressurized atmosphere in a state where the workpiece is placed in the processing container; forming a spacer polysilicon film to be a sacrificial film on the target surface on which the silicon oxide film and the silicon nitride film are exposed using a silicon precursor gas; and substituting the spacer polysilicon film with a substitution silicon oxide film by supplying thermal energy, oxygen radicals and hydrogen radicals onto the workpiece.

According to another embodiment of the present disclosure, there is provided a non-transitory computer-readable storage medium storing a program that is operated on a computer and controls an apparatus for forming a blocking silicon oxide film on a target surface on which a silicon oxide film and a silicon nitride film are exposed, wherein the program is executed to cause the computer to control the apparatus to perform the method described above.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a flow chart showing a method of forming a silicon oxide film according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Application Example of Silicon Oxide Film Forming Method>

Figure 1A:
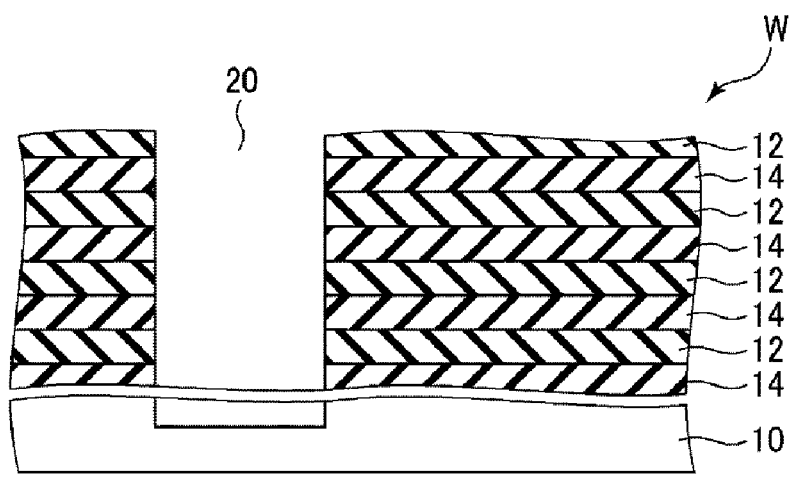
FIGS. 1A to 1C are cross-sectional process views showing a process of manufacturing a 3D-NAND type nonvolatile semiconductor device to which a method of forming a silicon oxide film according to an embodiment of the present disclosure is applied.
Figure 1B:
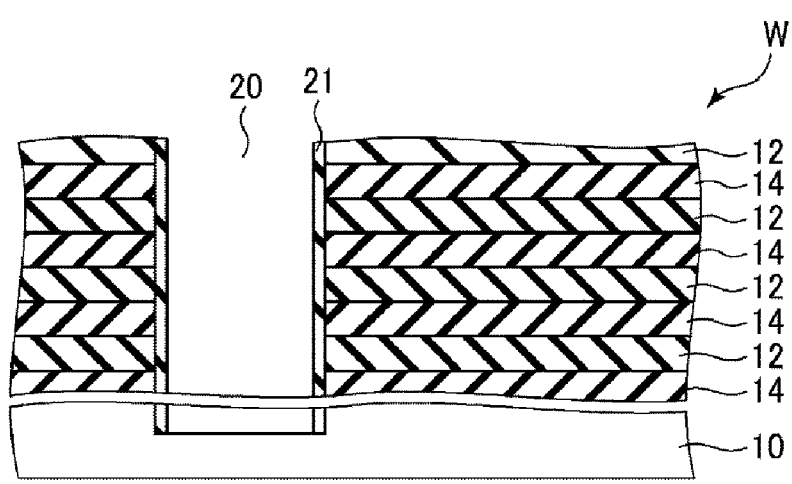
Figure 1C:
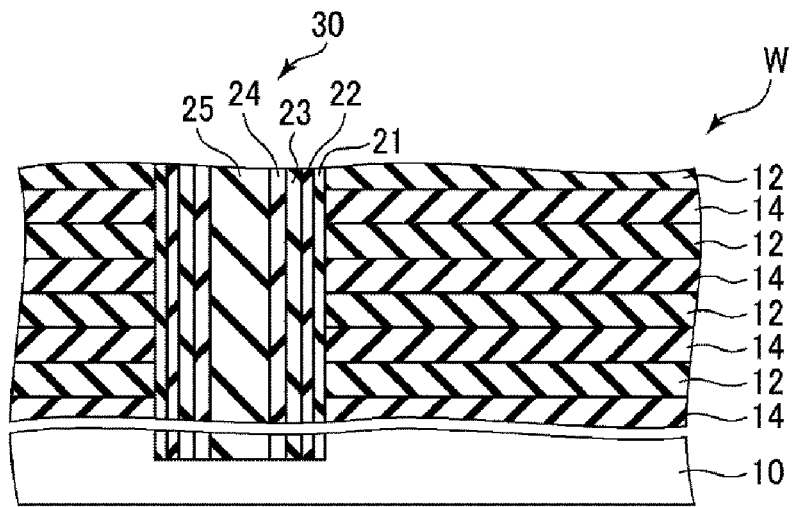

First, an application example of a method of forming a silicon oxide film according to an embodiment of the present disclosure will be described. FIGS. 1A to 1C are cross-sectional process views showing a process of manufacturing a 3D-NAND type nonvolatile semiconductor device to which a method of forming a silicon oxide film according to an embodiment of the present disclosure is applied.

FIG. 1A shows a semiconductor wafer W as a workpiece in a state where a plurality of SiO$_2$ films 12, which is an insulating film, and a plurality of SiN films 14, which is a sacrificial film, are alternately laminated on a semiconductor substrate (silicon substrate) 10 to form a laminated body and a memory hole 20 penetrating up to the semiconductor substrate 10 in the laminating direction is formed.

In this state, a blocking oxide film 21, which is a silicon oxide film of this embodiment, is formed on the target surface of the SiO$_2$ films 12 and the SiN films 14 exposed in the memory hole 20 (FIG. 1B).

Subsequent to the formation of the blocking oxide film 21, a charge accumulation layer 22 formed of a SiN film, a tunnel oxide film 23 formed of a SiO$_2$ film, and a channel body 24 formed of polysilicon are formed and a hole portion remaining at the center of the memory hole 20 is filled with a core insulation film 25 to form a memory part 30 (FIG. 1C).

Figure 2A:
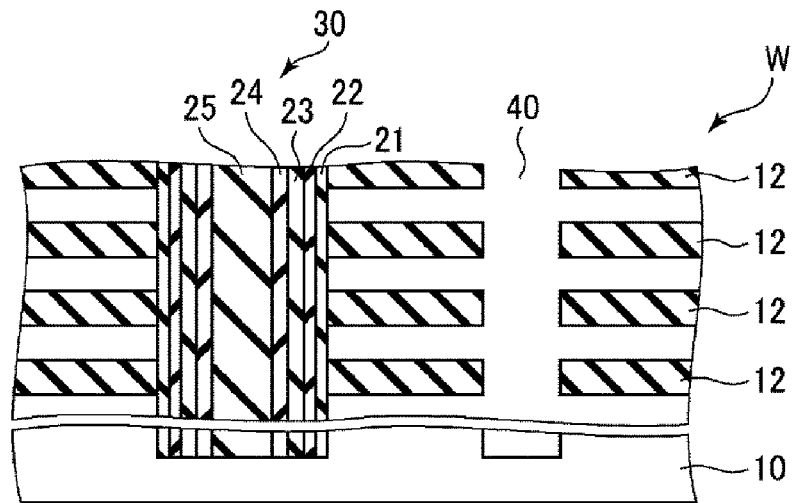
FIGS. 2A to 2C are cross-sectional process views showing a process of manufacturing a 3D-NAND type nonvolatile semiconductor device to which a method of forming a silicon oxide film according to an embodiment of the present disclosure is applied.
Figure 2B:
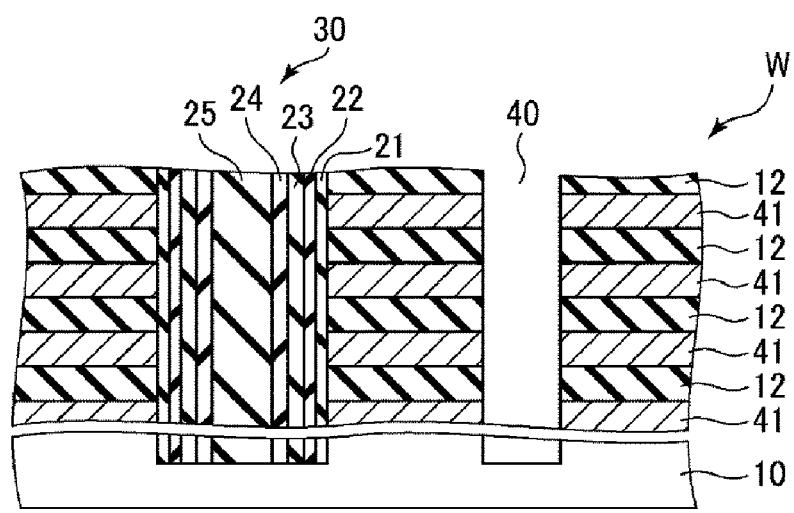
Figure 2C:
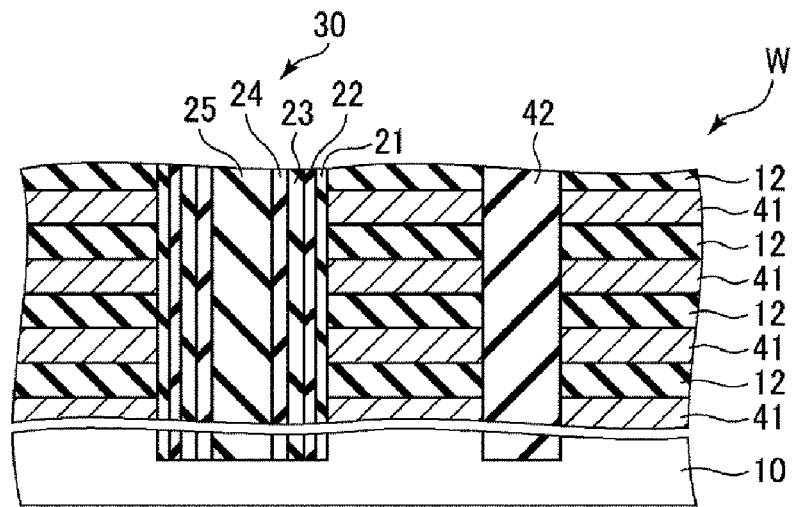

Next, a trench 40 is formed in the laminating direction and the SiN films as the sacrificial films are etched away through the trench 40 (FIG. 2A). Next, blocking Al$_2$O$_3$ films (not shown) and TiN films (not shown) serving as barrier films are formed in spaces obtained by etching away the SiN films and the spaces are filled with tungsten films 41 serving as gate electrodes (FIG. 2C). Next, the trench 40 is filled with a silicon oxide film 42 (FIG. 2C).

<Method of Forming Blocking Oxide Film>

Next, a method of forming a silicon oxide film (blocking oxide film) according to an embodiment of the present disclosure, which is performed in the above-described 3D-NAND type nonvolatile semiconductor device manufacturing process, will be described. The blocking oxide film is provided to prevent the charge accumulation layer 22 formed of the SiN film from being etched when the SiN films 14 as the sacrificial films are removed by wet etching.

FIG. 3 is a flow chart showing a method of forming a silicon oxide film (blocking oxide film) according to an embodiment of the present disclosure, and FIGS. 4A to 4D are cross-sectional process views at that time.

First, a wafer W having the structure of FIG. 1A is placed in a processing container (step S1). The interior of the processing container is brought into a depressurized state.

Figure 4A:
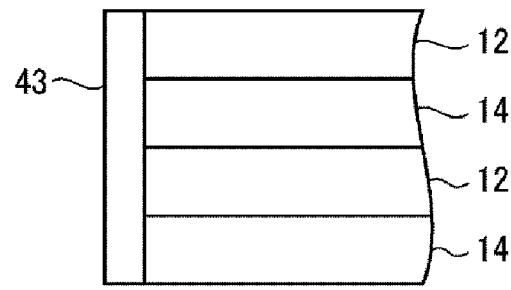
FIGS. 4A to 4D are cross-sectional process views showing a method of forming a silicon oxide film according to an embodiment of the present disclosure.

Next, a spacer polysilicon film (sacrificial film) 43 is formed on the exposed surfaces of the SiO$_2$ films 12 and the SiN films 14 in the memory hole 20 (step S2, FIG. 4A).

The spacer polysilicon film 43 may be formed by CVD. The film formation by CVD is carried out by placing the wafer W in the processing container, setting the interior of the processing container in a vacuum state while heating the wafer W to a predetermined temperature, and supplying a Si precursor gas into the processing container. In addition to the Si precursor gas, a doping gas such as phosphorus (P) or boron (B) may be supplied.

As the Si precursor, chlorine-containing silane-based compounds such as dichlorosilane (DCS; SiH$_2$Cl$_2$), monochlorosilane (MCS: SiClH$_3$), trichlorosilane (TCS; SiHCl$_3$), silicon tetrachloride (STC; SiCl$_4$), hexachlorodisilane (HCD; Si$_2$Cl$_6$) and the like, silane-based compounds such as monosilane (SiH$_4$), disilane (Si$_2$H$_6$) and the like, and aminosilane-based compounds such as trisdimethylaminosilane (TDMAS), butylaminosilane (BAS), bistert-butylaminosilane (BTBAS), dimethylaminosilane (DMAS), bisdimethylaminosilane (BDMAS), diisopmpylaminosilane (DIPAS) and the like can be used. Among these. HCD, DCS and TDMAS are preferably used.

The temperature at this time may be 600 to 760 degrees C. specifically, 680 degrees C. for HCD, 600 to 760 degrees C., specifically, 600 degrees C. for DCS, and 600 to 760 degrees C., specifically, 630 degrees C. for TDMAS. The pressure may be 0.5 to 10 Torr (66.7 to 1,333 Pa).

The spacer polysilicon film 43 is required to be thin enough to perform the sufficient substitution reaction in the next process, specifically about 1 to 4 nm.

Next, the spacer polysilicon film is substituted with a SiO$_2$ film by thermal energy, oxygen radicals (O*) and hydrogen radicals (H*) (step S3). At this time, it is assumed that the substitution reaction shown in the following formula (1) occurs due to the thermal energy. O* and H*, thereby substituting the polysilicon film with the SiO$_2$ film.

$$2Si+2H_2+O_2 \rightarrow SiO_2+SiH_4 \tag{1}$$

Figure 4B:
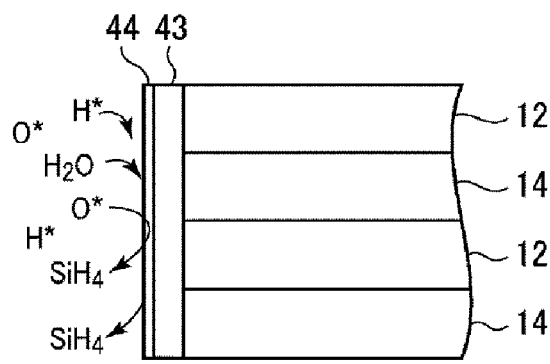
Figure 4C:
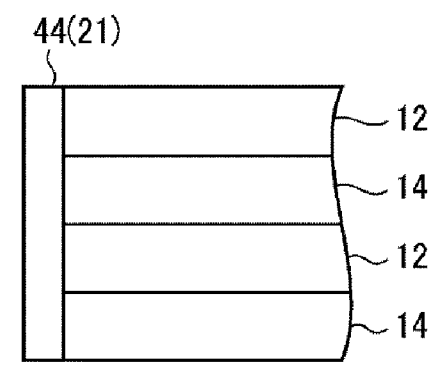

That is, Si—Si bonds are substituted with Si—O bonds using the thermal energy, O* and H*. Specifically, preferably, while setting the internal pressure of the processing container to 0.5 to 10 Torr (66.7 to 1,333 Pa) and heating the wafer W to a high temperature of 800 to 900 degrees C. to apply thermal energy, an O$_2$ gas and a H$_2$ gas are supplied into the processing container to generate O* and H* with the principle of low pressure radical oxidation (LPRO). As shown in FIG. 4B, when the generated O* and H* are supplied to the spacer polysilicon film 43, the reaction like the above-described formula (1) occurs in the spacer polysilicon film 43 by thermal energy and radicals. In accordance with this formula (1), the spacer polysilicon film 43 is partially substituted with $SiO_2$ to form a substitution $SiO_2$ film 44 while generating a $SiH_4$ gas. The above reaction continues, and finally, as shown in FIG. 4C, the entire spacer polysilicon film 43 becomes the substitution $SiO_2$ film 44 (formation of the substitution $SiO_2$ film 44). At this time, the substitution $SiO_2$ film 44 is somewhat thicker than the spacer polysilicon film 43. For example, the spacer polysilicon film 43 with a thickness of 3 nm becomes the substitution $SiO_2$ film 44 with a thickness of about 5 nm.

After forming a spacer polysilicon film with a thickness of 3 nm and subjecting it to substitution treatment by the above method, element analysis was performed by SIMS. The result showed that the spacer polysilicon film was almost completely substituted with a $SiO_2$ film.

Figure 4D:
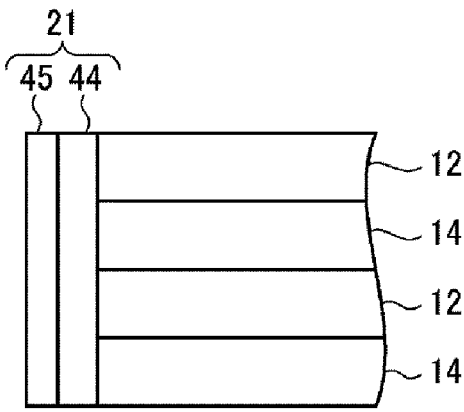

Next, a film thickness adjusting $SiO_2$ film 45 is formed (step S4, FIG. 4D). The film thickness adjusting $SiO_2$ film 45 is provided to adjust the film thickness of the blocking oxide film 21 and may be formed by ALD. That is, the spacer polysilicon film 43 is thinly formed from the viewpoint of complete substitution with $SiO_2$ film and from the viewpoint of film thickness adjustability, the spacer polysilicon film 43 is changed to the substitution $SiO_2$ film 44 by the substitution reaction, and then an insufficient film thickness is supplemented with the film thickness adjusting $SiO_2$ film 45 to form the blocking oxide film 21 having a predetermined thickness.

When forming the film thickness adjusting $SiO_2$ film 45 by ALD, a Si precursor gas and an oxidizing agent containing oxidizing species are alternately supplied into the processing container, with purging interposed therebetween, and the adsorption and oxidation of the Si precursor gas is repeated. The purging is a process of supplying a rare gas such as an Ar gas or an inert gas such as a $N_2$ gas into the processing container to discharge a residual gas in the previous process from the processing container.

At this time, the film formation by ALD can use the following two methods. The first method is to use low pressure radical oxidation (LPRO) and the second method is to use an ozone ($O_3$) gas as an oxidizing agent.

In the first method, an $O_2$ gas and a $H_2$ gas are radicalized at a high temperature of 700 to 750 degrees C. to generate oxygen radicals (O*) and hydrogen radicals (H*), which are used as oxidizing agents. At this time, the ratio of $O_2$ gas flow rate/($O_2$ gas+$H_2$ gas flow rate) may be 50 to 90%. According to the first method, it is possible to form a $SiO_2$ film having good film quality and obtain good wet-etching resistance.

In the second method, a $SiO_2$ film is formed at 600 degrees C. to 650 degrees C. by using an $O_3$ gas as an oxidizing agent. Since no hydrogen is used, a $SiO_2$ film containing less hydrogen in the film can be obtained. Although the wet etching resistance is inferior to the $SiO_2$ film by the first method, the dry etching resistance is high, which is advantageous when dry etching is included in subsequent processes.

In both of the first and second methods, the pressure may be 1 to 10 Torr (133 to 1,333 Pa) and the film thickness may be 20 nm or less. As the Si precursor, a chlorine-containing silane-based compound, a silane-based compound or an aminosilane-based compound can be used, and among these, the chlorine-containing silane-based compound is preferably used. As the chlorine-containing silane-based compound, DCS, MCS, TCS, STC or HCD can be used. Among these, HCD is preferably used.

When the thickness of the substitution $SiO_2$ film 44 is sufficient for the blocking oxide film 21, the blocking oxide film 21 can be formed only with the substitution $SiO_2$ film 44, eliminating a need to provide the film thickness adjusting $SiO_2$ film 45.

Figure 5A:
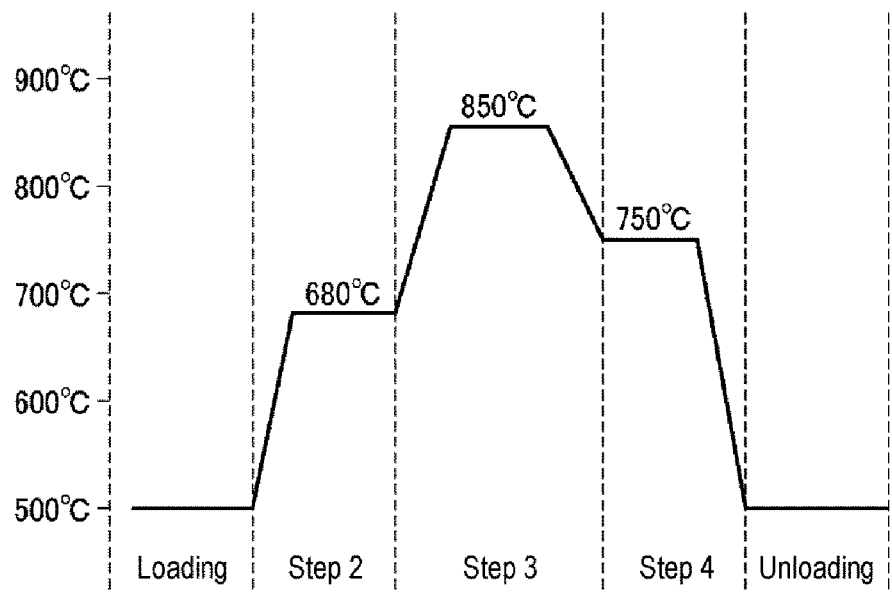
FIGS. 5A and 5B are views showing an example of a temperature flowchart of a method of forming a silicon oxide film according to an embodiment of the present disclosure.
Figure 5B:
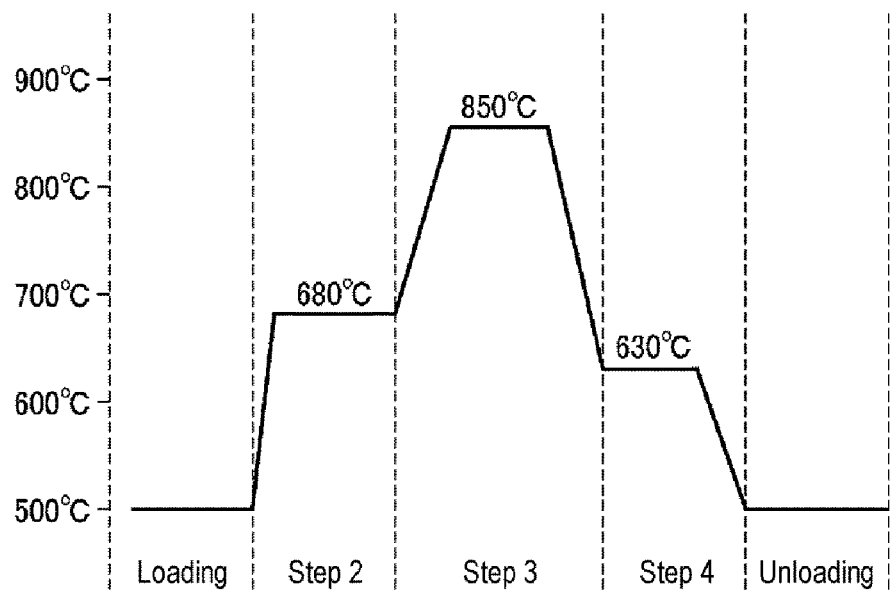

The blocking oxide film 21 is formed by the above steps S1 to S4. FIGS. 5A and 5B show temperature flowcharts of the steps S2 to S4 at this time. FIG. 5A shows a case where the first method is adopted in the step S4 and FIG. 5B shows a case where the second method is adopted in the step S4. The steps S2 to S4 are preferably performed in-situ, although there is a change in temperature.

Figure 6:
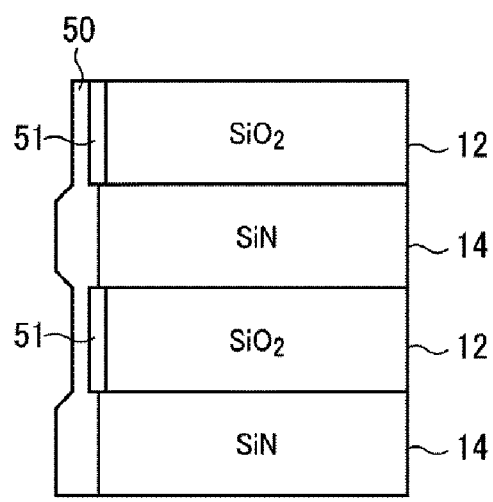
FIG. 6 is a cross-sectional view showing a state in which a SiO$_2$ film serving as a blocking oxide film is directly formed on the surfaces of a SiO$_2$ film and a SiN film by ALD.

As in the conventional technique shown in FIG. 6, when a $SiO_2$ film 50 to be a blocking oxide film is directly formed on the surfaces of the $SiO_2$ film 12 and the SiN film 14 by ALD, since sub-oxide (grown oxide) 51 is formed on the $SiO_2$ film 12, the incubation time of the $SiO_2$ film 12 is longer than that of the SiN film 14. Therefore, the formed $SiO_2$ film 50 is thinner at the $SiO_2$ film 12 portion and is thicker at the SiN film 14 portion thereof, which makes it difficult to form a thin and uniform $SiO_2$ film 50.

In contrast, in the present embodiment, first, since the spacer polysilicon film 43 is formed on the surfaces of the $SiO_2$ film 12 and the SiN film 14, a thin and uniform film can be formed without generating a grown oxide. Further, since this spacer polysilicon film 43 is subjected to radical treatment with O* and H* at a high temperature to cause the reaction of substitution of polysilicon with $SiO_2$, the substitution $SiO_2$ film 44 can be formed while maintaining a thin and uniform film thickness. The blocking oxide film 21 formed of the substitution $SiO_2$ film 44 and optionally the film thickness adjusting $SiO_2$ film 45 formed by ALD or the like can be uniformly formed with a desired thin film thickness.

In addition, by using the film thickness adjusting $SiO_2$ film 45, it is possible to form a blocking oxide film 21 having a desired film thickness after reliably substituting the spacer polysilicon film 43 formed as thin as possible with a $SiO_2$ film.

<Processing Apparatus>

Next, a processing apparatus for implementing the method of forming a silicon oxide film (blocking oxide film) according to the above embodiment will be described.

[First Example of Processing Apparatus]

Figure 7:
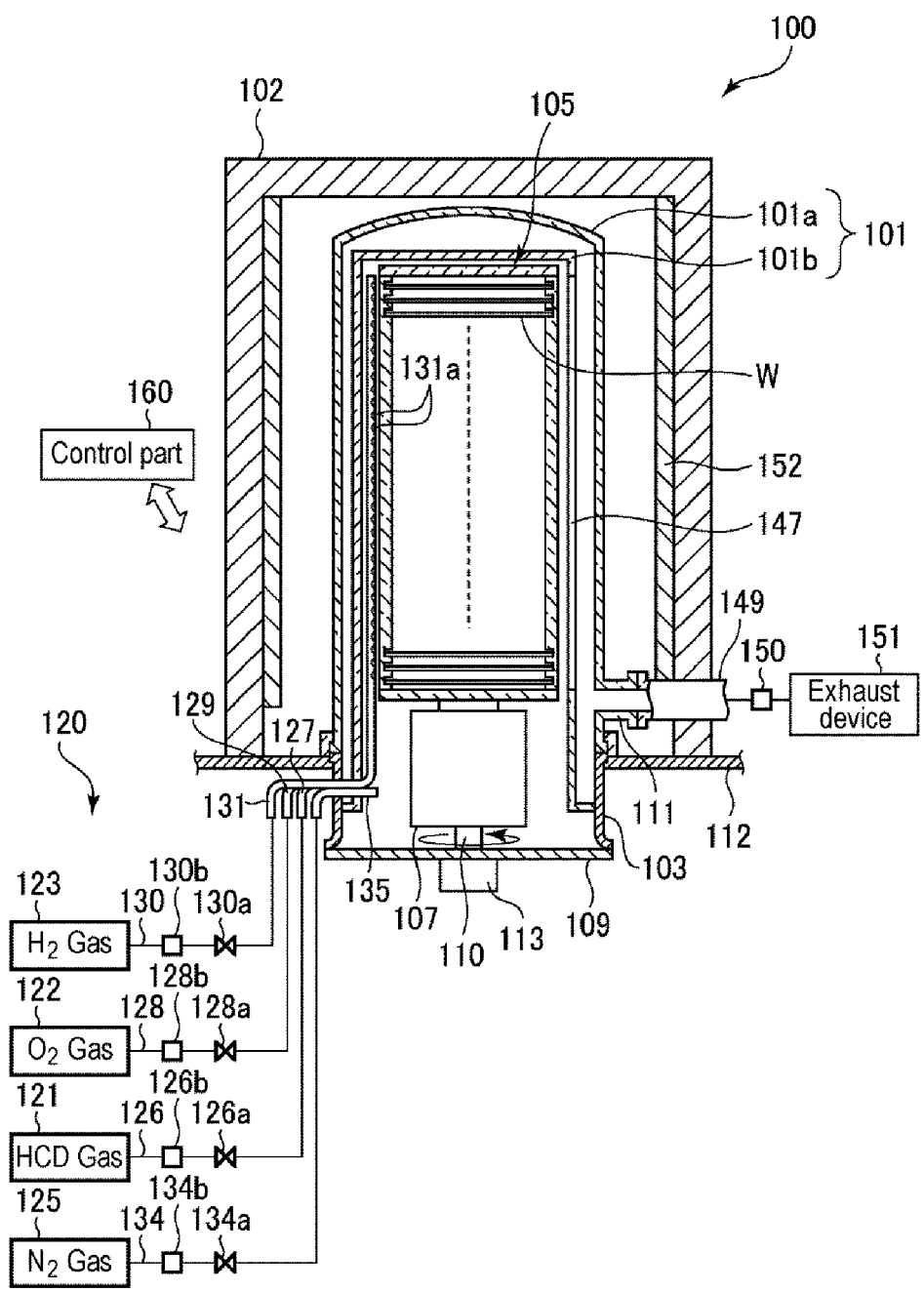
FIG. 7 is a longitudinal sectional view showing a first example of a processing apparatus capable of performing a method of forming a silicon oxide film according to the present disclosure.
Figure 8:
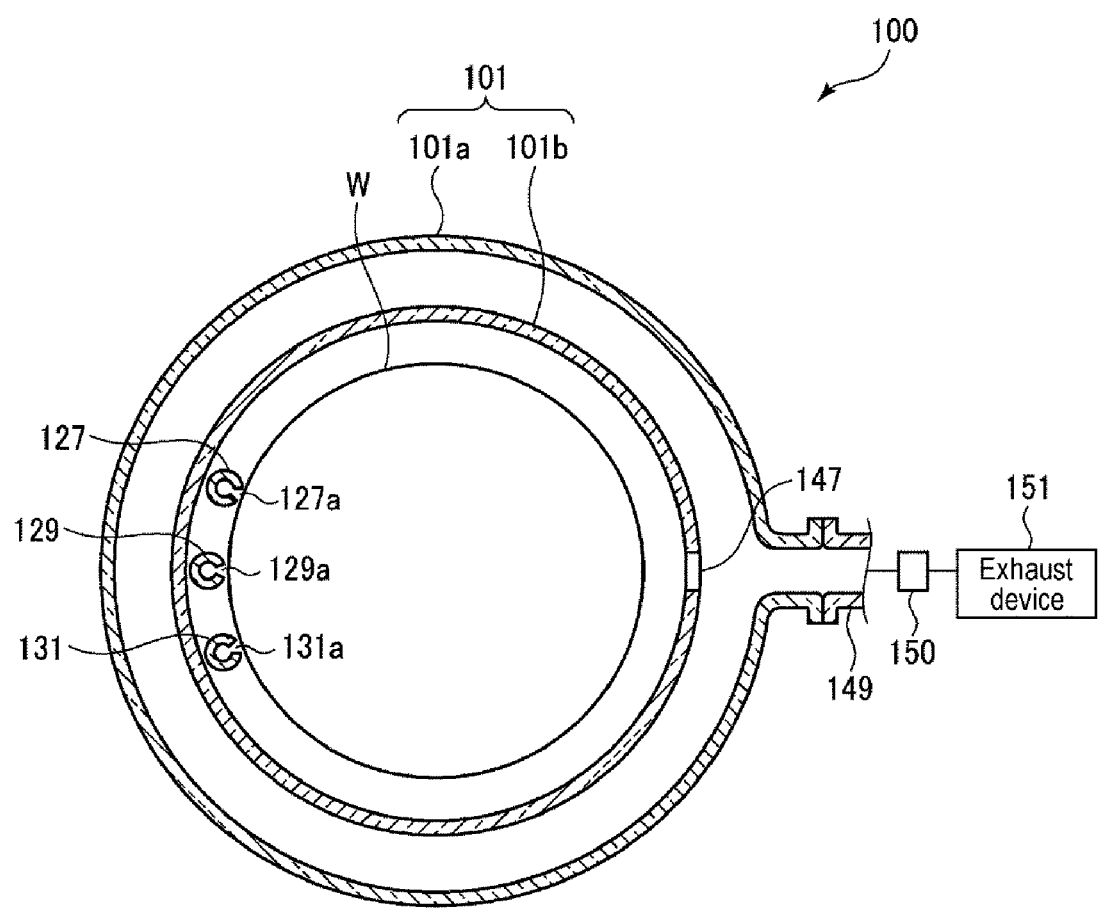
FIG. 8 is a horizontal sectional view showing a first example of a processing apparatus capable of performing a method of forming a silicon oxide film according to the present disclosure.

First, a description will be given of a first example of a processing apparatus capable of performing the step S4 by the first method. FIG. 7 is a longitudinal sectional view showing a first example of the processing apparatus and FIG. 8 is a horizontal sectional view thereof.

The processing apparatus 100 of this example is configured as a heating furnace which is a hot-wall type film forming apparatus, and includes a processing container 101 having a ceiling, which is configured as a reaction tube having a dual-tube structure composed of an outer tube 101a and an inner tube 101b. The processing container 101 is entirely made of, e.g., quartz. A quartz wafer boat 105 on which 50 to 150 wafers W are placed in multiple stages is disposed in the inner tube 101b of the processing container 101. A substantially cylindrical main body section 102 with its lower surface side opened is installed on the outer side of the processing container 101, and a heating mechanism 152 having a heater over the circumference is installed on the inner wall surface of the main body section 102. The main body section 102 is supported by a base plate 112.

A manifold 103 molded into a cylindrical shape by, for example, stainless steel is connected to a lower end opening portion of the outer tube 101a of the processing container 101 via a seal member (not shown) such as an O-ring or the like.

The manifold 103 supports the outer tube 101a of the processing container 101. The wafer boat 105 is inserted into the inner tube 101b of the processing container 101 from below the manifold 103. The bottom of the manifold 103 is closed by a lid 109.

The wafer boat 105 is placed on a heat insulating barrel 107 made of quartz and a rotating shaft 110 is attached to the heat insulating barrel 107 through the lid 109. The rotating shaft 110 can be rotated by a rotation driving mechanism 113 such as a motor or the like. Thus, the wafer boat 105 can be rotated via the heat insulating barrel 107 by the rotation driving mechanism 113. Incidentally, the heat insulating barrel 107 may be fixedly installed on the lid 109 to process the wafers W without rotating the wafer boat 105.

The processing apparatus 100 has a gas supply mechanism 120 for supplying various kinds of gases. The gas supply mechanism 120 includes a HCD gas supply source 121 for supplying a HCD gas, an $O_2$ gas supply source 122 for supplying an $O_2$ gas, a $H_2$ gas supply source 123 for supplying a $H_2$ gas, and a $N_2$ gas supply source 125 for supplying a $N_2$ gas which is an inert gas. A DCS gas or a TDMAS gas may be used instead of the HCD gas.

A pipe 126 is connected to the HCD gas supply source 121 and is also connected with a gas dispersion nozzle 127 made of quartz, which penetrates through the side walls of the manifold 103 and the inner tube 101b of the processing container 10 and is bent upward and extends vertically in the inner tube 101b. A pipe 128 is connected to the $O_2$ gas supply source 122 and is also connected with a gas dispersion nozzle 129 made of quartz, which penetrates through the side walls of the manifold 103 and the inner tube 101b and is bent upward and extends vertically in the inner tube 101b. A pipe 130 is connected to the $H_2$ gas supply source 123 and is also connected with a gas dispersion nozzle 131 made of quartz, which penetrates through the side walls of the manifold 103 and the inner tube 101b and is bent upward and extends vertically in the inner tube 101b. A pipe 134 is connected to the $N_2$ gas supply source 125 and is also connected with a linear gas dispersion nozzle 135 made of quartz, which penetrates through the side walls of the manifold 103 and the inner tube 101b and leads to the interior of the processing container 101.

On the pipe 126 are disposed an opening/closing valve 126a and a flow rate controller 126b such as a mass flow controller on the upstream side thereof. Similarly, on the pipes 128, 130 and 134 are respectively disposed opening/closing valves 128a, 130a and 134a and flow rate controllers 128b, 130b and 134b.

A plurality of gas discharge holes 127a, 129a and 131a corresponding respectively to the wafers W are formed at predetermined intervals in vertical portions of the gas dispersion nozzles 127, 129 and 131 over a length in the vertical direction corresponding to the wafer support range of the wafer boat 105 (only the gas discharge holes 131a are shown in FIG. 7). Thus, it is possible to discharge a gas substantially uniformly from the gas discharge holes 127a, 129a and 131a toward the processing container 101 in the horizontal direction.

Figure 9A:
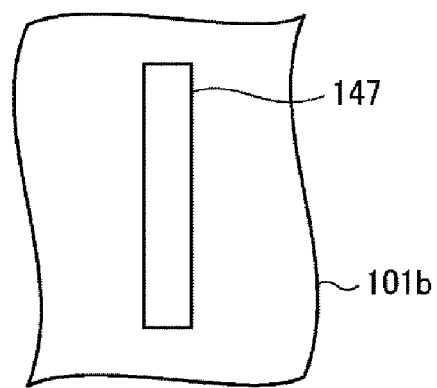
FIGS. 9A to 9C are views showing an example of a shape of an exhaust port formed in an inner tube of the apparatus of FIG. 7.
Figure 9B:
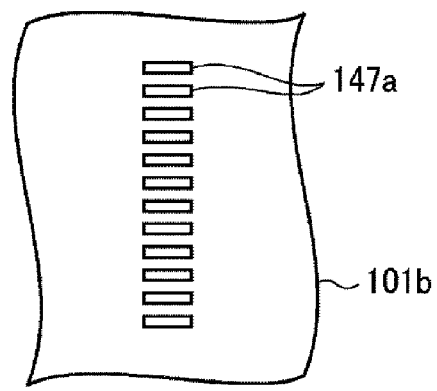
Figure 9C:
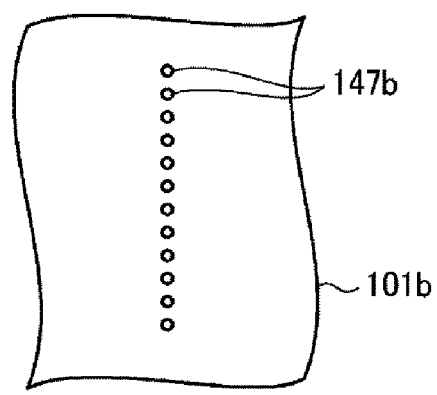

An exhaust opening 147 for evacuating the interior of the processing container 101 is provided in a portion of the inner tube 101b of the processing container 101 opposite to the arrangement position of the gas dispersion nozzles 127, 129 and 131. As shown in FIG. 9A, the exhaust opening 147 is elongated vertically corresponding to the wafer boat 105. On the other hand, an exhaust port 111 is formed in the outer tube 101a of the processing container 101 in the vicinity of the exhaust opening 147, and an exhaust pipe 149 for exhausting the processing container 101 is connected to the exhaust port 111. A pressure control valve 150 for controlling the internal pressure of the processing container 101 and an exhaust device 151 including a vacuum pump and the like are connected to the exhaust pipe 149, and the interior of the processing container 101 is exhausted by the exhaust device 151 via the exhaust pipe 149. In place of the elongated exhaust opening 147 in FIG. 9A, slit-shaped exhaust ports 147a as shown in FIG. 9B or hole-shaped exhaust ports 147b as shown in FIG. 9C may be installed.

The processing container 101 and the wafers W placed in the processing container 101 are heated to a predetermined temperature when the heating mechanism 152 inside the main body section 102 described above is fed with power.

The processing apparatus 100 has a control part 160. The control part 160 controls various components of the processing apparatus 100, for example, valves, a mass flow controller as a flow rate controller, a drive mechanism such as an elevating mechanism, the heating mechanism 152, and the like. The control part 160 has a main control part having a CPU, an input device, an output device, a display device and a storage device. A storage medium storing a program for controlling a process to be executed by the processing apparatus 100, that is, a process recipe, is set in the storage device, and the main control part calls the process recipe stored in the storage medium and controls the processing apparatus 100 to perform a predetermined process based on the called process recipe.

Next, a method of forming a $SiO_2$ film (blocking oxide film) using the processing apparatus 100 of the first example will be described.

A film forming process is performed as follows based on the process recipe stored in the storage medium in the control part 160.

First, a plurality of wafers W (for example, 50 to 150 wafers) having the structure shown in FIG. 1A are mounted on the wafer boat 105 in an atmospheric atmosphere, and the wafer boat 105 is inserted into the processing container 101 in the processing apparatus 100 from below to accommodate the plurality of wafers W into the inner tube 101b of the processing container 101. Then, the lower end opening portion of the manifold 103 is closed with the lid 109 to seal the inner space of the processing container 101.

Next, the interior of the processing container 101 is exhausted by the exhaust device 151 to set the internal pressure of the processing container 101 to a predetermined pressure in the range of 1 to 10 Torr (133 to 1,333 Pa). At the same time, a $N_2$ gas as an inert gas is supplied from the $N_2$ gas supply source 125 into the processing container 101 to put the interior of the processing container 101 under a predetermined depressurized $N_2$ gas atmosphere, and the temperature of the wafers W is raised to a predetermined temperature in the range of 600 to 760 degrees C., specifically, 680 degrees C., by the heating mechanism 152.

At the point of time when the temperature of the wafers W reaches the predetermined temperature, while the supply of the $N_2$ gas continues, a HCD gas is supplied along the surfaces of the wafers W from the gas discharge hole 127a through the pipe 126 and the gas dispersion nozzle 127 from the HCD gas supply source 121 to form a spacer polysilicon film on the surfaces of the $SiO_2$ film and the SiN film of the wafers W by CVD.

Next, a $N_2$ gas is supplied into the processing container 101 to purge the interior of the processing container 101, and the wafer temperature is raised to a predetermined temperature in the range of 800 to 900 degrees C. by the heating mechanism 152. Thereafter, an $O_2$ gas and a $H_2$ gas are respectively supplied onto the wafers W from the $O_2$ gas supply source 122 and the $H_2$ gas supply source 123 through the pipe 128/the gas dispersion nozzle 129 and the pipe 130/the gas dispersion nozzle 131 to generate O* and H* with the principle of LPRO by the high temperature of 800 to 900 degrees C. Thus, the spacer polysilicon film is substituted with a $SiO_2$ film (substitution $SiO_2$ film) by the thermal energy and the radicals.

Next, the interior of the processing container 101 is purged with the $N_2$ gas, the wafer temperature is controlled to a predetermined temperature in the range of 700 to 750 degrees C. while the $N_2$ gas is being supplied into the processing container 101, and a HCD gas is supplied along the surfaces of the wafers W from the gas discharge hole 127a through the pipe 126 and the gas dispersion nozzle 127 from the HCD gas supply source 121 and is adsorbed on the surfaces of the wafers W. Next, the supply of HCD gas is stopped, the interior of the processing container 101 is purged with the N2 gas, and then, an $O_2$ gas and a $H_2$ gas are respectively supplied onto the wafers W from the $O_2$ gas supply source 122 and the $H_2$ gas supply source 123 through the pipe 128/the gas dispersion nozzle 129 and the pipe 130/the gas dispersion nozzle 131 to generate O* and H* to cause the adsorbed Si to undergo low pressure radical oxidation (LPRO). Next, the supply of $O_2$ gas and $H_2$ gas is stopped, and the interior of the processing container 101 is purged with the $N_2$ gas. These operations are repeated a predetermined number of times to form a film thickness adjusting $SiO_2$ film having a predetermined thickness on the substitution $SiO_2$ film by ALD. Thus, a blocking oxide film composed of the substitution $SiO_2$ film and the film thickness adjusting $SiO_2$ film is formed.

After completion of the above-described process, the interior of the processing container 101 is purged with a $N_2$ gas and then is returned to the atmospheric pressure, and the wafer boat 105 is unloaded downward.

According to the processing apparatus of this example, since the above steps S2 to S4 can be performed in-situ, a good quality blocking oxide film can be formed with high productivity. In addition, it is possible to achieve a high quality film thickness adjusting $SiO_2$ film having high wet etching resistance since it is formed at the high temperature of 700 to 750 degrees C.

[Second Example of Processing Apparatus]

Figure 10:
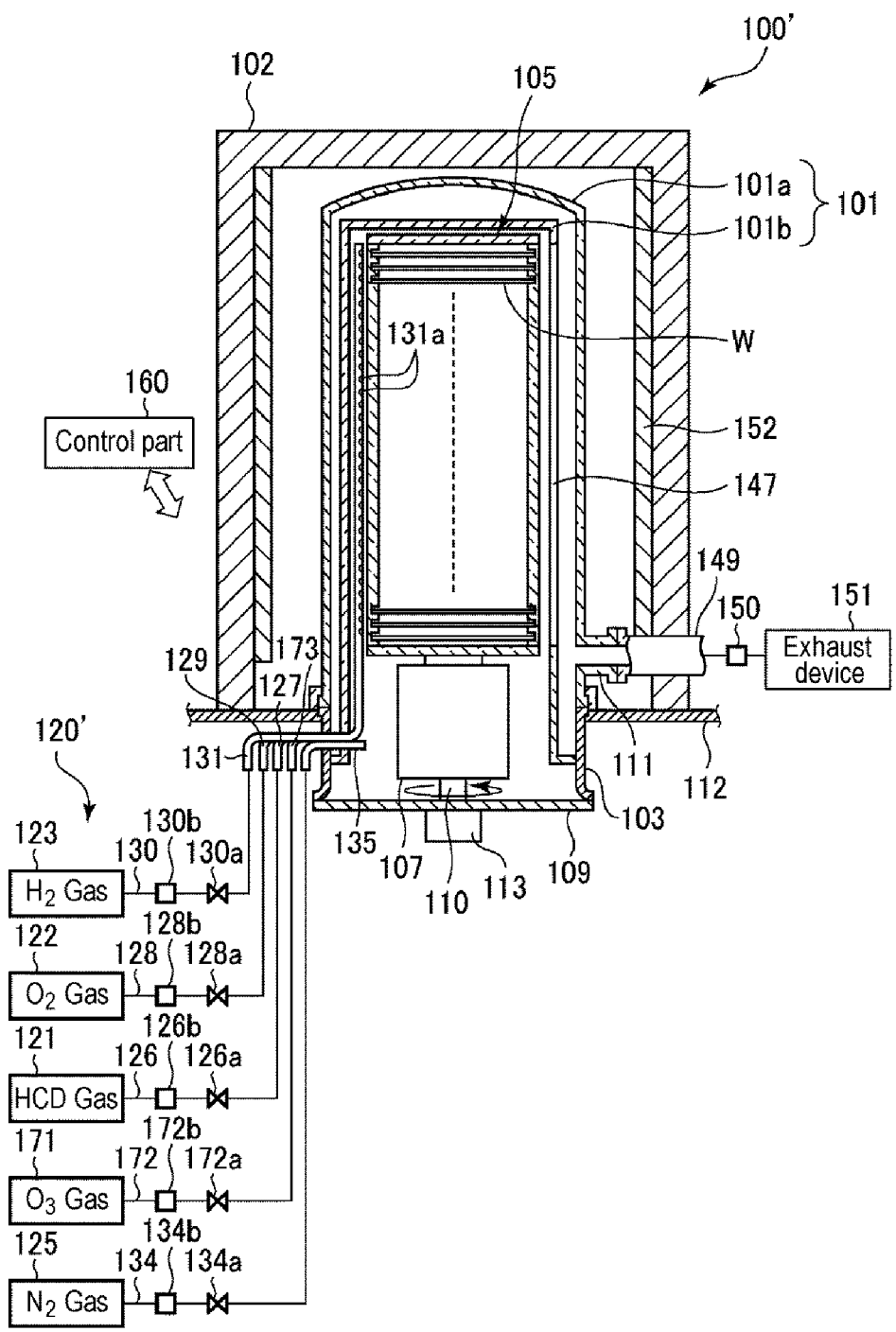
FIG. 10 is a longitudinal sectional view showing a second example of a processing apparatus capable of performing a method of forming a silicon oxide film according to the present disclosure.
Figure 11:
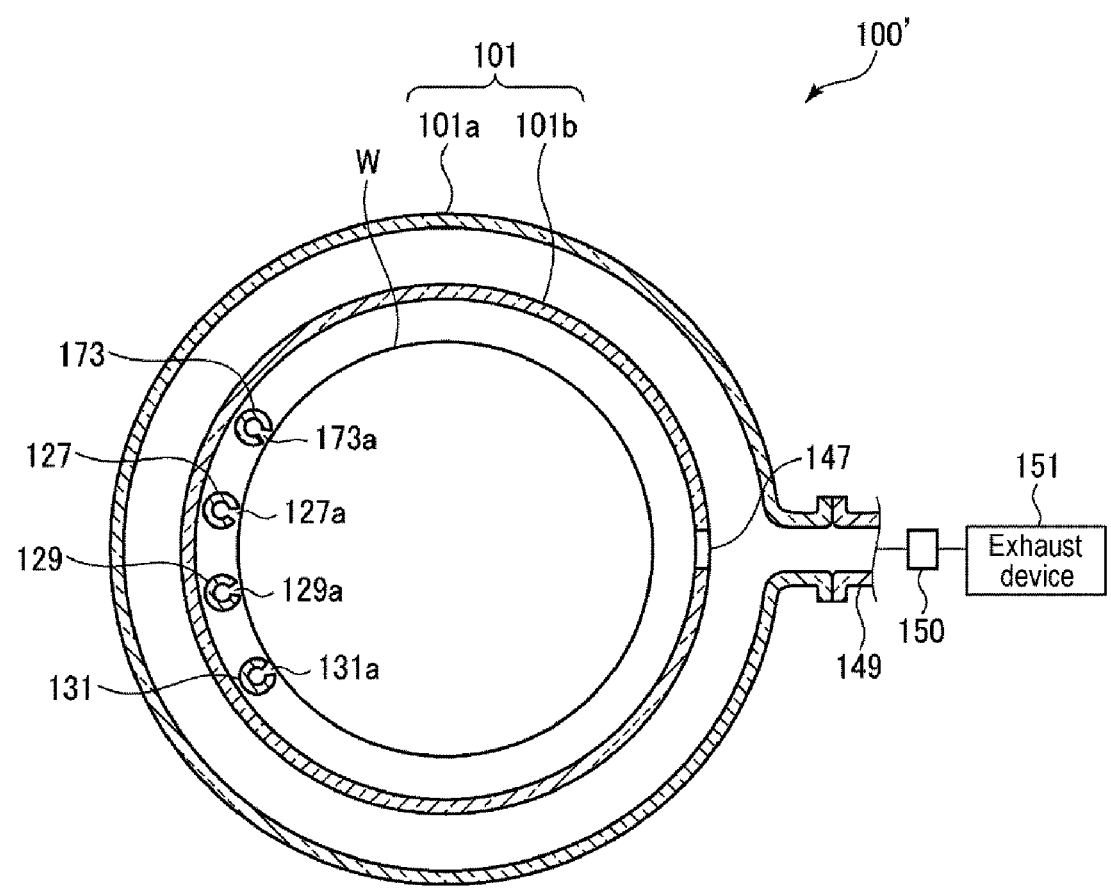
FIG. 11 is a horizontal sectional view showing a second example of a processing apparatus capable of performing a method of forming a silicon oxide film according to the present disclosure.

Next, a second example of the processing apparatus capable of performing the step S4 by the second method will be described. FIG. 10 is a longitudinal sectional view showing a second example of the processing apparatus and FIG. 11 is a horizontal sectional view thereof.

A processing apparatus 100' of this example has basically the same configuration as the processing apparatus 100 of the first example except that it has a gas supply mechanism 120' different from the gas supply mechanism 120 of the first example. In addition to the configuration of the gas supply mechanism 120, the gas supply mechanism 120' further includes an $O_3$ gas supply source 171, a pipe 172 connected to the $O_3$ gas supply source 171, and a gas dispersion nozzle 173 made of quartz. The gas dispersion nozzle 173 is connected to the pipe 172 and is bent upward and extends vertically in the processing container 101 after passing through the side walls of the manifold 103 and the inner tube 101b. A plurality of gas discharge holes 173a corresponding respectively to the wafers W are formed at predetermined intervals in vertical portions of the gas dispersion nozzle 173 over the length in the vertical direction corresponding to the wafer support range of the wafer boat 105. On the pipe 172 are disposed an opening/closing valve 172a and a flow rate controller 172b such as a mass flow controller on the upstream side thereof. Other configurations are the same as those of the processing apparatus 100 and therefore, explanation thereof will not be repeated.

Next, a method of forming a $SiO_2$ film (blocking oxide film) using the processing apparatus 100' of the second example will be described.

In this example, the substitution $SiO_2$ film is formed in exactly the same way as in the processing apparatus 100.

In forming a film thickness adjusting $SiO_2$ film, the interior of the processing container 101 is purged with a $N_2$ gas, the wafer temperature is controlled to a predetermined temperature in the range of 600 to 650 degrees C. while the $N_2$ gas is being supplied into the processing container 101, and a HCD gas is supplied along the surfaces of the wafers W from the gas discharge hole 127a through the pipe 126 and the gas dispersion nozzle 127 from the HCD gas supply source 121 and is adsorbed on the surfaces of the wafers W. Next, the supply of HCD gas is stopped, the interior of the processing container 101 is purged with the $N_2$ gas, and then an $O_3$ gas is supplied onto the wafers W from the $O_3$ gas supply source 171 through the pipe 172 and the gas dispersion nozzle 173 to oxidize the adsorbed Si. Next, the supply of $O_3$ gas is stopped, and the interior of the processing container 101 is purged with the $N_2$ gas. These operations are repeated a predetermined number of Limes to form a film thickness adjusting $SiO_2$ film having a predetermined thickness on the substitution $SiO_2$ film by ALD. Thus, a blocking oxide film composed of the substitution $SiO_2$ film and the film thickness adjusting $SiO_2$ film is formed.

After completion of the above-described process, the interior of the processing container 101 is purged with a $N_2$ gas and then is returned to the atmospheric pressure, and the wafer boat 105 is unloaded downward.

According to the processing apparatus of this example, since the above steps S2 to S4 can be performed in-situ, a good quality blocking oxide film can be formed with high productivity. In addition, since the film forming temperature of the film thickness adjusting $SiO_2$ film is lower than that of the first example, the wet etching resistance is inferior to that of the processing apparatus of the first example, but since the amount of H in the film can be made smaller than that in the first example, the dry etching resistance can be increased.

Other Applications

While the embodiments of the present disclosure have been described above, the present disclosure is not limited to the above-described embodiments but various modifications can be made without departing from the scope of the present disclosure.

For example, it has been illustrated in the above-described embodiments that, when a 3D-NAND type nonvolatile semiconductor device is formed, the present disclosure is applied to a case where a blocking oxide film is formed on the exposed surfaces of the $SiO_2$ film and the SiN film of the memory holes formed in the laminated film of the $SiO_2$ film and the SiN film. However, the present disclosure is not limited thereto but can be applied to any case as long as it is possible to form a $SiO_2$ film uniformly on the surfaces of the $SiO_2$ film and the SiN film.

In addition, it has been illustrated in the above-described embodiments that the film thickness adjusting $SiO_2$ film is formed by ALD. However, without being limited to ALD, the film thickness adjusting $SiO_2$ film may be formed by other methods such as CVD.

Further, it has been illustrated in the above-described embodiments that a vertical batch type apparatus is used as the processing apparatus. However, the present disclosure is not limited thereto but may be applied to a horizontal batch type apparatus, a single wafer type apparatus and a semi-batch type apparatus in which a plurality of workpieces are placed and processed on a rotary table.

According to the present disclosure in some embodiments, since a spacer polysilicon film is first formed on a target surface on which a silicon oxide film and a silicon nitride film are exposed and then is substituted with a silicon oxide film, it is possible to suppress generation of sub-oxide (grown oxide) and hence form a thin silicon oxide film having a uniform film thickness.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a blocking silicon oxide film comprising:
    placing a workpiece having a target surface, which is a side surface of a laminated body in which a silicon oxide film and a silicon nitride film are alternately laminated, in a processing container under a depressurized atmosphere;
    forming a spacer polysilicon film to be a sacrificial film on the target surface as a spacer of the laminated body; and
    substituting the spacer polysilicon film with a substitution silicon oxide film by supplying thermal energy, oxygen radicals and hydrogen radicals onto the workpiece, so as to form the blocking silicon oxide film.

2. The method of claim 1, wherein the substituting the spacer polysilicon film with the substitution silicon oxide film includes generating the oxygen radicals and the hydrogen radicals by supplying an oxygen gas and a hydrogen gas while heating the workpiece to a temperature in a range of 800 to 900 degrees C., and substituting the spacer polysilicon film with the substitution silicon oxide film by the oxygen radicals and the hydrogen radicals.

3. The method of claim 1, wherein the forming a spacer polysilicon film includes forming the spacer polysilicon film by CVD by supplying precursor gas onto the processing container.

4. The method of claim 3, wherein the forming a spacer polysilicon film is preformed using a chlorine-containing silane-based gas, a silane-based gas or an aminosilane-based gas as the silicon precursor gas.

5. The method of claim 1, further comprising: after the substituting the spacer polysilicon film with the substitution silicon oxide film, forming another silicon oxide film on a side surface of the substitution silicon oxide film, the another silicon oxide film constituting the blocking silicon oxide film and functioning to adjust a thickness of the blocking silicon oxide film.

6. The method of claim 5, wherein the forming another silicon oxide film includes forming the another silicon oxide film by ALD by alternately supplying a silicon precursor gas and oxidizing species.

7. The method of claim 6, wherein the forming another silicon oxide film uses the oxygen radicals and the hydrogen radicals generated by supplying an oxygen gas and a hydrogen gas while heating the workpiece to 700 to 750 degrees C., as the oxidizing species.

8. The method of claim 6, wherein the forming another silicon oxide film uses an ozone gas as the oxidizing species.

9. The method of claim 6, wherein the forming another silicon oxide film includes using a chlorine-containing silane-based gas as the silicon precursor gas.

10. The method of claim 1, wherein, in a semiconductor wafer forming a 3D-NAND nonvolatile semiconductor device as the workpiece, the target surface is a surface being exposed in a memory hole formed in the laminated body in a laminating direction.

* * * * *

UNITED STATES PATENT AND TRADEMARK OFFICE
CERTIFICATE OF CORRECTION

PATENT NO. : 10,964,530 B2  
APPLICATION NO. : 16/173214  
DATED : March 30, 2021  
INVENTOR(S) : Ko et al.

Page 1 of 1

It is certified that error appears in the above-identified patent and that said Letters Patent is hereby corrected as shown below:

In the Claims

Claim 3, Column 12, Line 11, please delete the phrase "by CVD by supplying precursor gas" and insert the phrase --by CVD by supplying a silicon precursor gas--.

Signed and Sealed this  
Fourth Day of May, 2021

Drew Hirshfeld  
*Performing the Functions and Duties of the*  
*Under Secretary of Commerce for Intellectual Property and*  
*Director of the United States Patent and Trademark Office*